US007184938B1

(12) United States Patent
Lansford et al.

(10) Patent No.: US 7,184,938 B1
(45) Date of Patent: Feb. 27, 2007

(54) METHOD AND SYSTEM FOR STATISTICAL FILTERS AND DESIGN OF STATISTICAL FILTERS

(75) Inventors: James L. Lansford, Austin, TX (US); Shyam Sunder Chander, Sunnyvale, CA (US)

(73) Assignee: Alereon, Inc., Austin, TX (US)

( * ) Notice: Subject to any disclaimer, the term of this patent is extended or adjusted under 35 U.S.C. 154(b) by 0 days.

(21) Appl. No.: 11/218,335

(22) Filed: Sep. 1, 2005

Related U.S. Application Data

(60) Provisional application No. 60/606,479, filed on Sep. 1, 2004.

(51) Int. Cl.
*G06F 15/00* (2006.01)
*G01R 13/02* (2006.01)
(52) U.S. Cl. .................... 702/190; 702/196; 702/69
(58) Field of Classification Search ............. 702/190, 702/191, 196, 69; 703/2, 3
See application file for complete search history.

(56) References Cited

U.S. PATENT DOCUMENTS 6,167,359 A * 12/2000 Demir et al. ............. 702/191

* cited by examiner

*Primary Examiner*—John Barlow
*Assistant Examiner*—Meagan S Walling
(74) *Attorney, Agent, or Firm*—Sprinkle IP Law Group

(57) ABSTRACT

Systems and methods for the design or implementation of statistical filters for use in the spectral shaping of transmissions are disclosed. A desired power spectrum may be mapped to find pole locations that approximate the desired spectrum. These pole locations may then be mapped to the edge or inside of an equilateral polygon lying inside a unit circle, the equilateral polygon having the same number of sides as the order of the statistical filter desired and one vertex mapped to unity, to yield a set of eigenvalues. These eigenvalues may be the eigenvalues of a stochastic matrix the elements of which may be the Markov transition probabilities for use in a statistical filter designed to achieve the desired power spectrum. Use of a statistical filter employing these Markov transition values may be utilized to shape UWB or other signals to achieve the desired power spectrum.

20 Claims, 5 Drawing Sheets

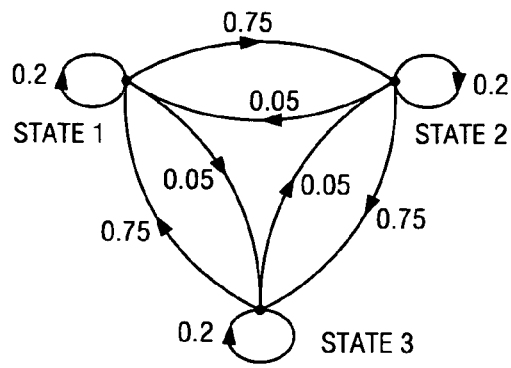
*FIG. 4*
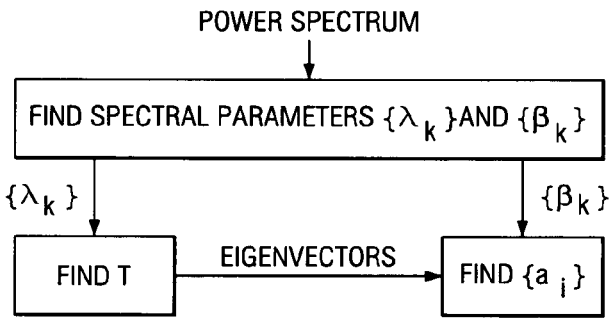
*FIG. 5*
| MATRIX STRUCTURE | | | EIGEN VALUE | MAGNITUDE | PHASE | FREQUENCY | FILTER |
|---|---|---|---|---|---|---|---|
| [0.75 | 0 | .25] | (0.6250+0.2165i) | 0.6614 | 0.3335 | 0.05 | LOW PASS |
| [0.63 | .37 | 0] | (0.4450+0.3204i) | 0.5483 | 0.6240 | 0.10 | LOW PASS |
| [0.45 | .55 | 0] | (0.1750−0.4763i) | 0.5074 | 1.2187 | 0.20 | BAND PASS |
| [0.35 | .65 | 0] | (0.6250+0.5629i) | 0.5635 | 1.5264 | 0.25 | BAND PASS |
| [0.20 | .70 | .05] | (−0.200+0.6062i) | 0.6383 | 1.8895 | 0.30 | BAND PASS |
| [0.05 | .15 | .80] | (−0.425+0.5629i) | 0.7053 | 2.2175 | 0.35 | BAND PASS |
| [0.00 | .40 | .6] | (−0.500+0.1732i) | 0.5291 | 2.8081 | 0.45 | HIGH PASS |
| [0.00 | .45 | .55] | (−0.500+0.0866i) | 0.5074 | 2.9701 | 0.48 | HIGH PASS |
*FIG. 6*

METHOD AND SYSTEM FOR STATISTICAL FILTERS AND DESIGN OF STATISTICAL FILTERS

RELATED APPLICATIONS

This application claims a benefit of priority under 35 U.S.C. § 119(e) to U.S. Provisional Patent Application No. 60/606,479 by inventors Jim Lansford and Shyam Sunder Uma Chander entitled "System and Method For Pulse Shape Filtering" filed on Sep. 1, 2004, the entire contents of which are hereby expressly incorporated by reference for all purposes.

TECHNICAL FIELD OF THE INVENTION

The invention relates in general to methods and systems for statistical filters, and more particularly, to the design and implementation of statistical filters tuned for a particularly shaped power spectrum.

BACKGROUND OF THE INVENTION

Recently, wireless data, entertainment and mobile communications technologies have become increasingly prevalent, particularly in the household environment. The convergence of these wireless data, entertainment and mobile communications within the home and elsewhere has created the need for merging many disparate devices into a single wireless network architecture capable of seamlessly supporting and integrating the requirements of all of these devices. Seamless connectivity and rapid transfer of data, without confusing cables and wires for various interfaces that will not and cannot talk to each other, is a compelling proposition for a broad market.

To that end, communication industry consortia such as the MultiBand OFDM Alliance (MBOA), Digital Living Network Alliance (DLNA) and the WiMedia Alliance are establishing design guidelines and standards to ensure interoperability of these wireless devices. For example, Wireless 1394, Wireless USB, and native IP-based applications are currently under development based on Ultrawideband (UWB) radio or WiMedia Convergence Platform.

Although it began as a military application dating from the 1960s, UWB has recently been utilized as a high data rate (480+Mbps), short-range (up to 20 meters) technology that is well suited to emerging applications in the consumer electronics, personal computing and mobile markets. When compared to other existing and nascent technologies capable wireless connectivity, the performance benefits of UWB are compelling. For example, transferring a 1 Gbyte file full of vacation pictures from a digital camera to a computer take merely seconds with UWB compared to hours using other currently available, technologies (i.e. Bluetooth) and consume far less battery power in doing so.

Typically, devices which employ UWB utilize a fixed channel bandwidth that is static in frequency, or a fixed channel bandwidth that can be frequency agile. In either case, the bandwidth utilized by a device must remain substantially fixed. Thus, the range and data rate of the device is, for the most part, determined by the modulation/coding of the signal, and the power with which the signal is transmitted.

In most cases as UWB, by definition, is spread over a broad spectral range, the power spectral density of a signal utilized by a UWB device is usually very low, and hence, usually results in low incidence of interference with other systems which may be utilizing the same bandwidth as the UWB device or system.

Power spectral density, however, is a function of distance. Consequently, if a UWB device was in close proximity to another wireless system there is a significant potential for interference between the UWB device and the wireless system.

Additionally, there may be frequency bands within a UWB channel where it is important to suppress interference. For example, some existing UWB spectrum allocation encompasses the C-Band satellite downlinks. Thus, there is a potential for UWB systems to interfere with television reception of those types of system.

As can be seen then, being able to control the shape and energy of a UWB signal is important for a myriad number of reasons, including regulatory, commercial and interference issues. One approach to deal with these types of issues is to employ a pulse shaping filter to the UWB waveform prior to transmission or reception of a UWB signal. Utilizing a pulse shaping filter, interference or overlap between the bandwidths of the UWB devices and a wireless system may be minimized.

Various types of digital notch filters have typically been applied to a signal to shape the power spectrum of the signal. In most cases, these digital notch filters are finite impulse response filters of several bits. These types of digital notch filters, however, are highly problematic in real-world applications as they tend to be highly disruptive, distorting the pulse shape of a transmitted UWB signal, introducing ringing and interchip interference and hence destroying information contained in the pulse shape while making the signal harder to decode. These types of disruptions occur mainly because of spectral loss and time dispersion side effects of the finite impulse response filters. In addition, certain types of these pulse shaping filters may add cost and complexity.

Statistical filters, on the other hand, may be used to introduce correlation to a bit stream that doesn't distort the resulting pulse shape of a signal, but that changes the power spectrum of that signal. Additionally, a key aspect of a statistical filter such as this is that it may have a smooth roll-off in a transition band and the slope in the transition band may be relatively low. Unfortunately, due to the mathematical complexity of statistical filter, equation based design of these filters is difficult. More specifically, traditionally it has been difficult to design a statistical filter to meet the specification of a given power spectrum. While various sorts of line coding techniques have been experimented with, no systematic method has been demonstrated in the literature that can shape a line code to fit an arbitrary spectral shape.

Thus, as can be seen, there is a need for methods and systems for the design and implementation of statistical filters in conjunction with the shaping of a power spectrum of a signal.

SUMMARY OF THE INVENTION

Systems and methods for the design or implementation of statistical filters for use in the spectral shaping of transmissions are disclosed. These statistical filters may be especially useful in an ultra-wideband (UWB) environment. More specifically these statistical filters may be designed and utilized to help achieve a desired power spectrum for pulses in UWB devices or systems. The desired power spectrum may be mapped to find pole locations that approximate the desired spectrum. These pole locations may then be mapped to the edge or inside of an equilateral polygon lying inside a unit circle, the equilateral polygon having the same number of sides as the order of the statistical filter desired and one vertex mapped to unity, to yield a set of eigenvalues. These eigenvalues may be the eigenvalues of a stochastic matrix the elements of which may be the Markov transition probabilities for use in a statistical filter designed to achieve the desired power spectrum. Use of a statistical filter employing these Markov transition values may be utilized to shape UWB or other signals to achieve the desired power spectrum.

In one embodiment, a statistical filter of this type may be designed to implement a band pass, band stop, high pass or low pass filter. More particularly, in some embodiments a statistical filter of this type may be used to implement a band stop filter for shaping UWB signals such that to the power of a UWB signal or transmission is substantially reduced between around 3.5 GHz and around 4.2 GHz.

In some embodiments, a table may be utilized to obtain a circulant matrix for a particular eigenvalue. Each of the entries in the table may comprise at least a circulant matrix and an associated eigenvalue. By looking up the eigenvalue in a table a corresponding circulant matrix can be obtained, and the values of this circulant matrix used as the transition values for the statistical filter. Portions of the entries of the table may be constructed by using a summed structure or a ringed structure.

Aspects of the invention will provide the technical advantage of allowing the resolution of a wide variety of interference issues between devices which utilize overlapping portions of the same spectrum. More specifically, the present invention will allow the implementation of filters which allow a significant amount of spectrum shaping with less data or signal distortion than previous spectrum shaping techniques. Furthermore, the present invention allows the design and implementation of filters which can provide spectrum shaping for a wide variety of transmission methodologies and which can be designed and implemented based on a desired power spectrum.

These, and other, aspects of the invention will be better appreciated and understood when considered in conjunction with the following description and the accompanying drawings. The following description, while indicating various embodiments of the invention and numerous specific details thereof, is given by way of illustration and not of limitation. Many substitutions, modifications, additions or rearrangements may be made within the scope of the invention, and the invention includes all such substitutions, modifications, additions or rearrangements.

BRIEF DESCRIPTION OF THE DRAWINGS

The drawings accompanying and forming part of this specification are included to depict certain aspects of the invention. A clearer impression of the invention, and of the components and operation of systems provided with the invention, will become more readily apparent by referring to the exemplary, and therefore nonlimiting, embodiments illustrated in the drawings, wherein identical reference numerals designate the same components. Note that the features illustrated in the drawings are not necessarily drawn to scale.

FIG. 4 depicts a diagram of an exemplary Markov model.

FIG. 5 depicts a flow diagram for an embodiment of a method of designing a statistical filter.

FIG. 6 depicts a representation of a table.

DETAILED DESCRIPTION

The invention and the various features and advantageous details thereof are explained more fully with reference to the nonlimiting embodiments that are illustrated in the accompanying drawings and detailed in the following description. Descriptions of well known starting materials, processing techniques, components and equipment are omitted so as not to unnecessarily obscure the invention in detail. Skilled artisans should understand, however, that the detailed description and the specific examples, while disclosing preferred embodiments of the invention, are given by way of illustration only and not by way of limitation. Various substitutions, modifications, additions or rearrangements within the scope of the underlying inventive concept(s) will become apparent to those skilled in the art after reading this disclosure.

Reference is now made in detail to the exemplary embodiments of the invention, examples of which are illustrated in the accompanying drawings. Wherever possible, the same reference numbers will be used throughout the drawings to refer to the same or like parts (elements).

Figure 1:
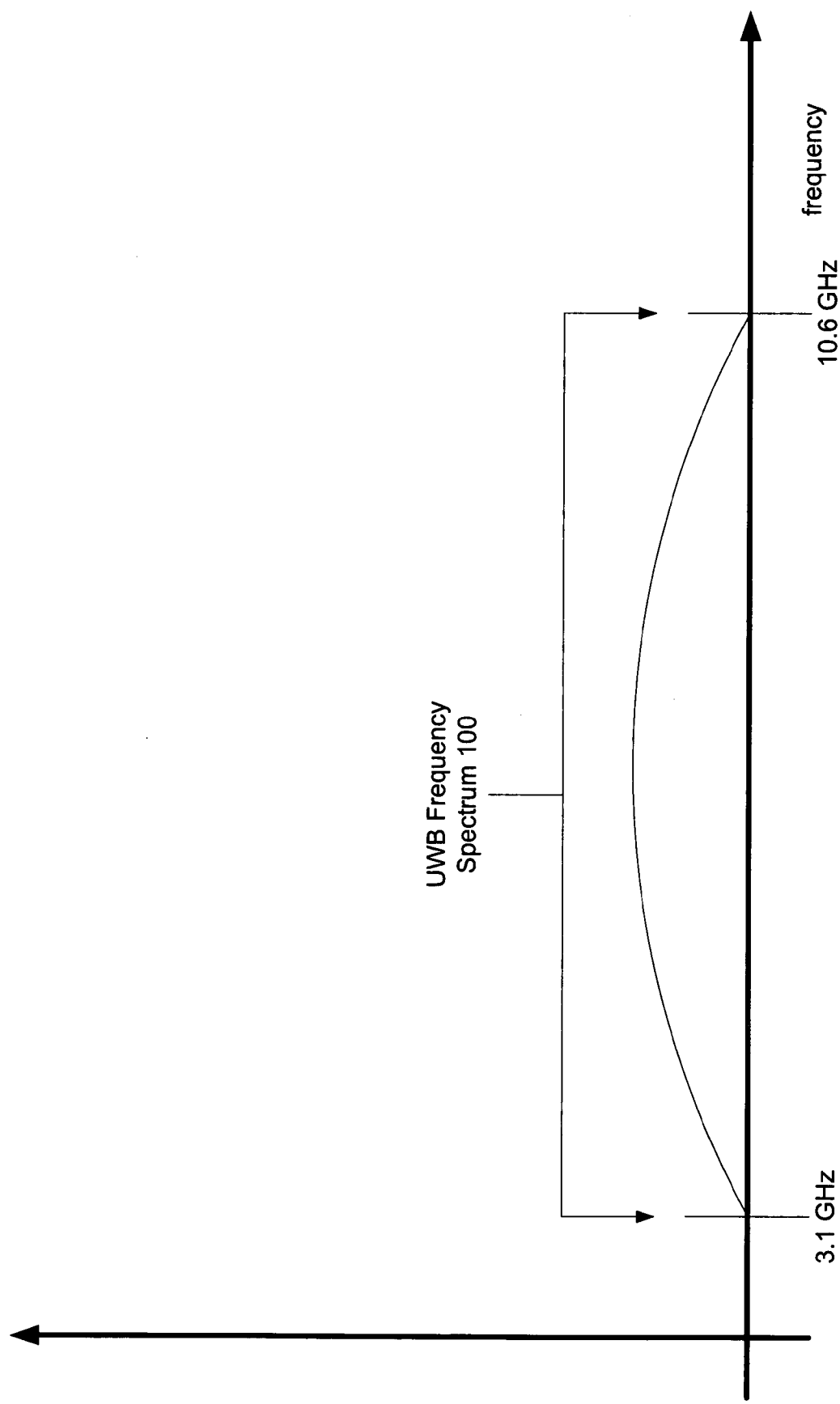
FIG. 1 depicts a frequency spectrum.

Before discussing specific embodiments of the present invention, exemplary frequencies and sub-bands for use in describing the present invention will be presented. Turning to FIG. 1, one embodiment of a frequency spectrum is illustrated. Frequency spectrum 100 encompasses the radio spectrum from 3.1 GHz to 10.6 GHz, and has been allocated by the FCC to "ultrawideband" technology. The term "ultrawideband" was first coined by the U.S. Department of Defense in 1989, and early applications leveraged the technology's properties as ground-penetrating radar.

Today, the definition for ultrawideband (UWB), according to the FCC, is any radio technology with a spectrum that occupies greater than 20 percent of the center frequency of a minimum of 500 MHz. Recognizing the advantages of new products that could incorporate this technology to benefit public safety, enterprise and consumer applications, in 2002 the FCC allocated radio spectrum 100 from 3.1 GHz to 10.6 GHz expressly for these purposes. Additionally, spectrum 100 is also available for use by medical, scientific, law enforcement, and fire and rescue organizations.

Rather than requiring a UWB radio to use this entire 7.5 GHz band to transmit information, or even a substantive portion of it, the FCC defined a specific minimum bandwidth of 500 MHz at a −10 dB level. This minimum bandwidth (in conjunction with other requirements of the FCC ruling) substantially protects incumbent users of the spectrum. The flexibility provided by the FCC ruling greatly expands the design options for UWB communication systems. Designers are free to use a combination of sub-bands within the spectrum to optimize system performance, power consumption and design complexity. UWB systems can still maintain the same low transmit power as if they were using the entire bandwidth by interleaving the symbols across these sub-bands.

Figure 2:
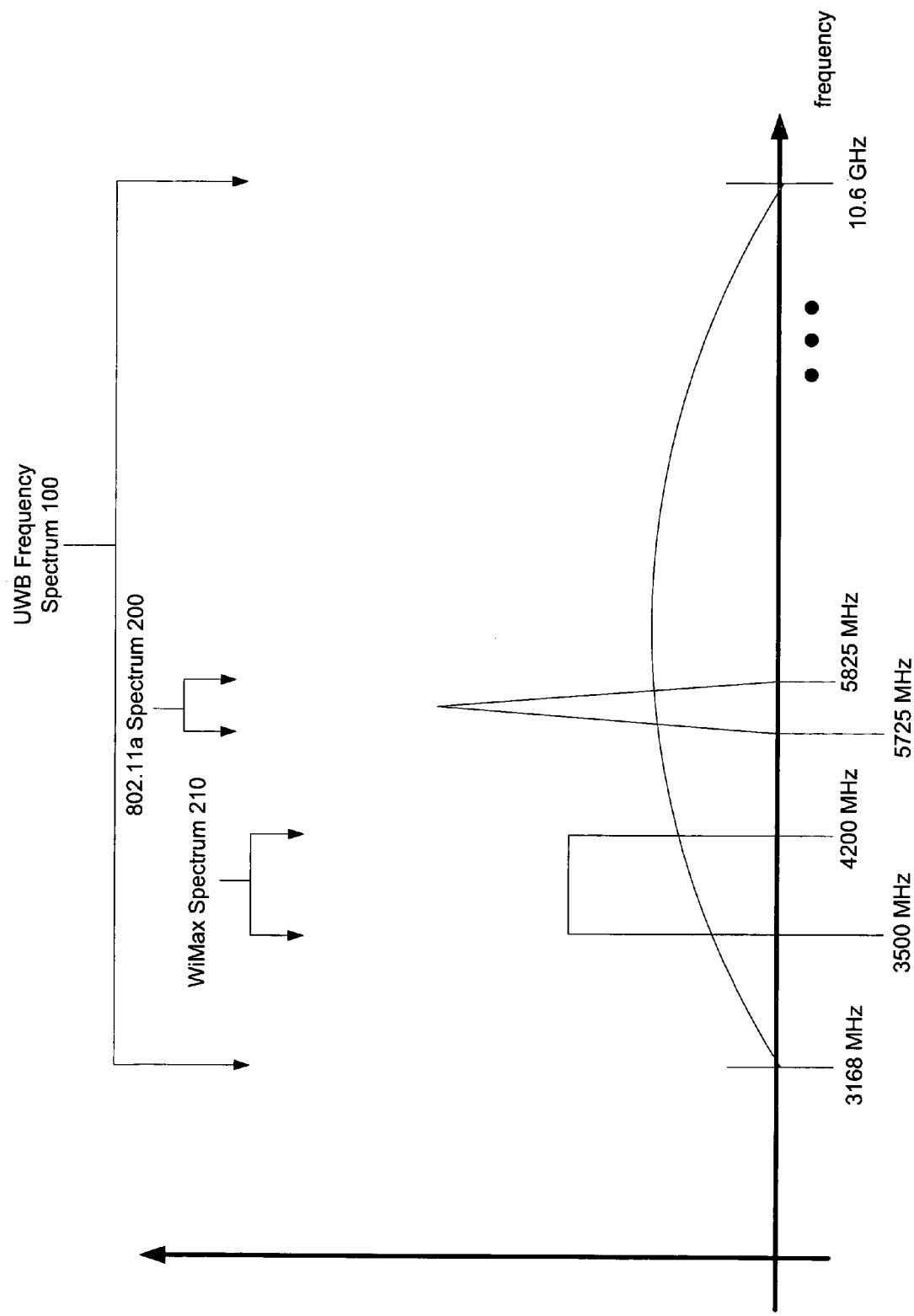
FIG. 2 depicts a set of different frequency spectrums.

It will be apparent that a variety of UWB devices and systems may utilize spectrum 100, however. This may be problematic, as other standards have evolved which also call for the utilization of portions of radio spectrum 100. Turning to FIG. 2, other frequency spectrums which are utilized by other technologies and overlap with frequency spectrum 100 are depicted.

Frequency spectrum 200 depicts one example of a frequency spectrum for use with IEEE 802.11a compliant devices. The IEEE 802.11a amendment to the original IEEE 802.11 standard was ratified in 1999. The IEEE 802.11a standard uses the same core protocol as the original IEEE 802.11 standard, usually operates in the 5 GHz band, and usually utilizes 52-subcarrier orthogonal frequency-division multiplexing.

Frequency spectrum 210 depicts one example of a frequency spectrum for use with embodiments of WiMAX compliant devices according to the IEEE 802.16 standard. The original WiMAX standard, IEEE 802.16, specifies WiMAX in the 10 to 66 GHz range. However, newer standards have specified frequency spectrum 210 as the operating range for embodiments of WiMAX devices.

As can be seen, there is a certain amount of overlap between frequency spectrums 100, 200 and 210. Thus, there may be a desire to reduce interference between devices utilizing frequency spectrums 100, 200 or 210. In some cases, this non-interference may be mandated by regulatory agencies or standard setting bodies. For example, it may be mandated by a regulatory agency that if an UWB device utilizes frequency spectrum 100, this device may not broadcast in frequency spectrum 210 if it detects another device broadcasting in frequency spectrum 210, as it may be intended to reserve spectrum 210 solely for WiMAX devices. Consequently, it is desirable to have methods and systems which are capable of regulating the frequency spectrum or power spectrum of a particular device while minimizing disruption to the signal.

Attention is now directed to systems and methods for the design or implementation of statistical filters for use in the spectral shaping of transmissions. These statistical filters may be especially useful in an ultra-wideband (UWB) environment. More specifically these statistical filters may be designed and utilized to help achieve a desired power spectrum for pulses in UWB devices or systems. The desired power spectrum may be mapped to find pole locations that approximate the desired spectrum. These pole locations may then be mapped to the edge or inside of an equilateral polygon lying inside a unit circle, the equilateral polygon having the same number of sides as the order of the statistical filter desired and one vertex mapped to unity, to yield a set of eigenvalues. These eigenvalues may be the eigenvalues of a stochastic matrix the elements of which may be the Markov transition probabilities for use in a statistical filter designed to achieve the desired power spectrum. Use of a statistical filter employing these Markov transition values may be utilized to shape UWB or other signals to achieve the desired power spectrum.

Figure 3:
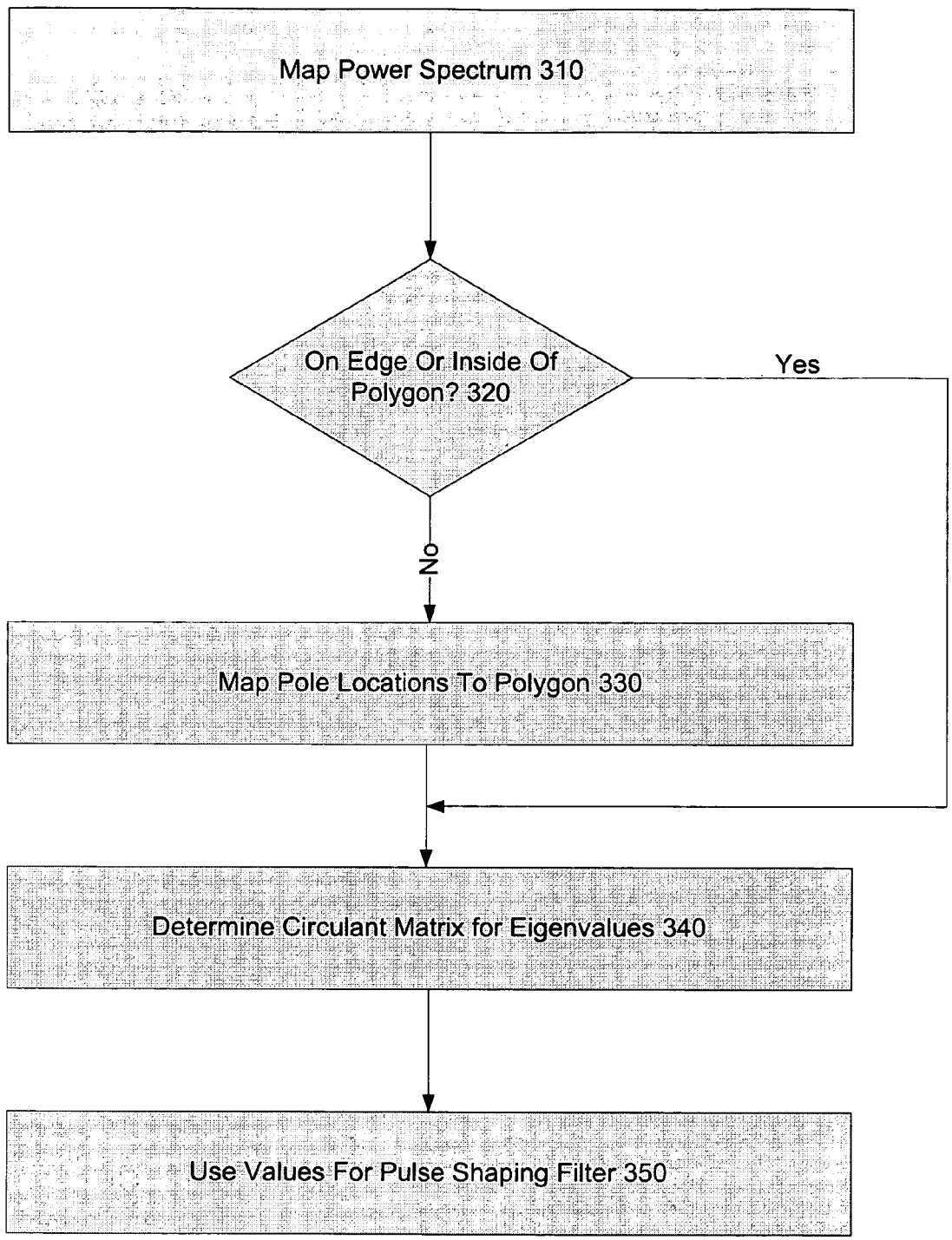
FIG. 3 depicts a flow diagram for one embodiment of a method of designing a statistical filter.

FIG. 3 depicts a flow diagram for one such embodiment of the systems and methods of the present invention. A desired power spectrum may be mapped to find pole locations that approximate the spectrum at step 310. This power spectrum may be substantially representative of a power spectrum produced by a desired type of filter, such as a low pass filter, band pass filter, band stop filter, band reject filter etc. In one embodiment, at step 310 the eigenvectors associated with a given spectral shape are derived for a specified filter order N. Note that one pole location may be at Z=1, so only N−1 unique poles will exist. To derive these eigenvectors, if given a time series x(n), autoregressive analysis may performed on x(n) to yield the pole locations $\lambda_1$–$\lambda_{N-1}$. Methods of autoregression analysis are depicted in Kay, Stephen M., *Modern Spectral Estimation: Theory and Application*, Prentice Hall, 1988 which is fully incorporated herein by reference, and will yield a proper set of eigenvalues.

Alternatively, if only the power spectral shape is given, then the eigenvalues can be derived at step 310 using many different techniques such as the minimum Lp error design described by Deczky, A. G., "*Synthesis of recursive Digital Filters using the Minimum P-Error Criterion*," IEEE Trans. On Audio and Electroacoustics, AU-20, No. 4, pp. 257–263, October 1972, which is fully incorporated herein by reference or minimum mean squared error design as described in Steiglitz, K., "*Computer-Aided Design of Recursive Digital Filters*," IEEE Trans. On Audio and Electroacoustics, 18, pp. 123–129, 1970, which is also fully incorporated herein by reference. In one embodiment, the minimum phase versions of the above mentioned techniques is chosen, hence the numerator of the model polynomial may be set identically to 1.

The pole locations determined at step 310, however, may not be feasible solutions for a Markov spectrum shaping system. Thus, once these pole locations are found, it may be determined at step 320 if the pole locations found at step 310 are on the edges, or inside of, an equilateral polygon laying inside a unit circle in the Z-plane, having the same number of sides as the order of the statistical filter desired and one vertex mapped to unity If these pole locations are not inside the polygon (NO branch of step 320), these pole locations may be mapped to the edge of or inside of the polygon at step 330. In one embodiment, the mapping of these pole locations may be accomplished by scaling the magnitude of the pole location or eigenvalue such that the new magnitude lies on or inside the above described polygon.

The values of the pole locations can then be used as the eigenvalues for a probability transition matrix at step 340. In one embodiment, the corresponding circulant matrix for those eigenvalues is determined at step 340. The values of the circulant matrix determined at step 340 can then be used as the Markov transition probabilities for a filter which may serve as a pulse shaping filter which results in the desired power spectrum at step 350.

More particularly, in one embodiment of the invention a statistical filter may be obtained by utilizing a Markov Chain Random Process (MCRP) derived by associating a real number to each state of a Markov Chain. A sample three state Markov model is shown in FIG. 4. Markov chain 400 has three states and so an MCRP based on this Markov chain 400 may use three real numbers to come up with the output map. A possible outcome is {2, 1, 3, 1, 2, 3 . . . }, indicating that Markov chain 400 began in state 2, transitioned to state 1, then to state 3, and so on.

The descriptions herein with respect to embodiments of the present invention will be concerned with stationary Markov chains, though others may be used. For a random process to be stationary, the statistics of the process may be time-invariant. The condition for a Markov chain to be stationary, s(n) may be such that $s^T(n)=S^T(n)T$ for all n. A state distribution s(n) which makes the Markov chain stationary will be called a stationary distribution of Markov chain and is denoted by s. The transitional probability matrix for three state Markov model 400 is given by $$T = \begin{bmatrix} .20 & .75 & .05 \\ .05 & .20 & .75 \\ .75 & .05 & .20 \end{bmatrix}$$

and the output of Markov model 400 is given by a=(a1 a2 a3).

Statistical filters designed using embodiments of the present invention may be based on MCRP power spectral density computation. A flow diagram of one such embodiment is shown in FIG. 5, where T—Transitional probability matrix, a—real numbers associated with 'n' states of a Markov Chain i.e. output mapped values. {Si}—Stationary Probabilities S=S1+S2+S3=1, S—Diagonal matrix of stationary probabilities, {λk}—Eigenvalues of stochastic matrix T, {βk}—Spectral coefficient-depends on stochastic matrix T and output mapped value [a]

A given power spectrum may be desired and mapped using techniques such as impulse invariance (STEP 310). In this case, power spectral density may be given by the equation:

$$\phi(\omega) = \sum_{k=1}^{N-1} \beta_k \left( \frac{1}{1 - \lambda_k e^{j\omega}} + \frac{1}{1 - \lambda_k e^{-j\omega}} - 1 \right) \quad \text{(Eq. 1)}$$

Manipulating the power spectrum to a correct form may be equivalent to determining the MCRP spectral parameters {λk} and {βk}, where the λk may be the eigenvalues corresponding to the pole locations in the Z-Plane. Once these eigenvalues are computed from Eq. 1 (STEP 330) a stochastic matrix can be determined from the eigenvalues (STEP 340). For purposes of this example, this stochastic matrix will be referred to as 'T'. Stochastic matrices are characterized by having real, non negative elements and by the fact that each row of the sums to unity. There are several classes of stochastic matrices which have a desirable eigen decomposition and may be used for purposes of this invention, however circulant matrix structures are simple and have a direct relation between eigenvalues and the elements of T, and thus may be useful for purposes of embodiments of the present invention.

A stochastic eigenvalue problem would be to find a stochastic matrix that has a given set of eigenvalues. If the matrix is any N×N matrix, then this would be an almost trivial problem. As for example, a companion matrix where the matrix purely depends upon the given characteristic polynomial. However, it is particularly useful if the matrix is a stochastic matrix. Finding a transition probability matrix with a given set of eigenvalues is a difficult problem. In fact, there may be no solution at all as it is not possible to solve directly for a stochastic matrix given a set of eigen values. Thus, it is useful in embodiments of the present invention if the stochastic matrix utilized is a circulant matrix (and hence an MCRP with a circulant transition probability matrix).

The benefit of MCRPs with circulant transition probability matrices is that there is a straightforward relationship between the desired spectral parameters {λk} and {λk} and the MCRP parameters in [T] and [a].

The task therefore becomes to find a stochastic matrix T which has a desired set of eigenvalues (STEP 340). In one embodiment of the invention a structure for T is assumed and the parameters adjusted to obtain a desired power spectrum. The eigenvalues {λκ}, or the poles used to design a statistical filter, influence the shape of the power spectrum produced by that statistical filter. That is, by an appropriate choice of eigenvalues, the center frequency ($f_c$) of the resulting filter can be defined. The gain (dB) of the resulting filter can be varied by the choice of output mapped values [a] while the spectral coefficients {βκ} have an influence on the gain of the resulting filter.

In one embodiment, a table may be developed for certain types of filters to assist in the design and implementation of low pass, high pass, band pass, or band stop filter structures among others. For example, a table may be developed for a third order statistical filter structure. An example table for a third order filter structure is depicted in FIG. 6.

The reason for using a third order structure in this example is because a third order filter may be a realistic order for a statistical filter. Note that in this case, one pole of the statistical filter will be a one as each row in a stochastic matrix adds up to one. The other two poles form a complex conjugate pair, which provide the appropriate filter characteristics.

Additionally, note that in table 500, only the first row of a circulant matrix is given, as other rows can be obtained from the first row using the circulant structure of the matrix. Both the rectangular and polar coordinates of the eigenvalue is given in the table. The frequency column denotes the center frequency ($f_c$) of a filter implemented using transitional values implied by the values of the corresponding circulant matrix. That is, the peak of the power spectrum is obtained at that normalized frequency. The last column in table 500 gives substantially the filter characteristic designed for the assumed matrix structure T. Thus, reading table 500 for the matrix structure for the first entry 510 on the table shows that $$T = \begin{bmatrix} .75 & 0 & .25 \\ .25 & .75 & 0 \\ 0 & .25 & .75 \end{bmatrix}$$

and the output map value a=[−2 1.5 0.3].

In one embodiment, to obtain the circulant matrices in table 500 two or more circulant structure matrices are summed and used together. These summed structures are based on the fact that if several independent processes are summed, the power spectrum of the resulting filter using the summed structure is substantially the sum of the power spectrum which would be obtained from a filter implemented according to each process. If {$y_i(n)$} are independent random processes and the summed structure is given by w(n)=$\Sigma_i y_i(n)$ then the power spectrum is $\phi_w(\omega)=\Sigma_i \phi y_i(w)$. The concept here is to partition the {λk} and {βk} spectral parameters and find the MCRPs which meet the parameters for each partition. These MCRPs will be called as sub-chains and can be summed to get the desired process for an entry in table 500. If $T_i$ is the transitional probability matrices for the subchains then $T_i=T_1 \otimes T_2 \otimes \ldots \otimes T_M$, where $\otimes$ corresponds to the Kronecker product (the element-by element product of the matrices). The desired output map is found from an element-by-element sum of the output maps [$a_i$].

In a summed structure such as that described above several MCRPs may be added to form a larger process. The main problem with this approach is that large numbers of states are required. To address this problem, in some embodiments, ring structures may be utilized to generate entries in table 500. Ring structures may utilize several MCRPs connected together by a Markov Chain. Note that the ring structure may correspond to a doubly stochastic matrix structure. That is, each sub chain in the ring structure may be connected to every other structure using a Markov Chain.

Once a stochastic matrix for a particular power spectrum is obtained, a statistical filter using a MCRP can be implemented by using the time domain techniques of convolution. Additionally a state diagram for a statistical filter can be computed from the stochastic matrix. Once all the characteristic weights of the states and the transitional probabilities are obtained the impulse response of the filter h[n] may be tapped from any of the states of the state diagram.

Figure 7:
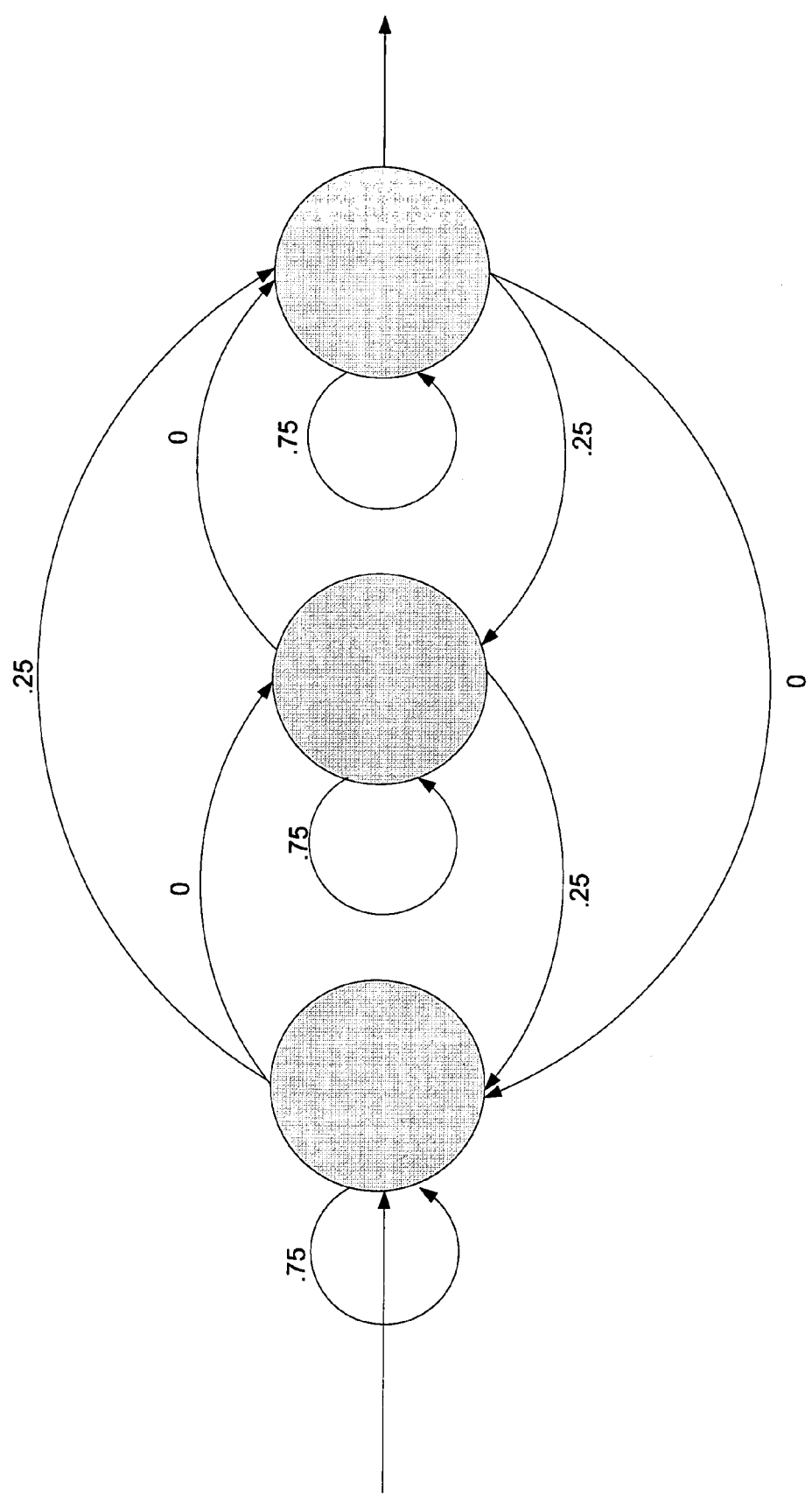
FIG. 7 depicts a state diagram representing the transitional probabilities of a statistical filter.

FIG. 7 represents a state diagram for one embodiment of a statistical filter which is implemented according to the stochastic matrix $$T = \begin{bmatrix} .75 & 0 & .25 \\ .25 & .75 & 0 \\ 0 & .25 & .75 \end{bmatrix}.$$

Notice that in state diagram 700, the transitions between each of states 710, 720, 730 correspond to a value of circulant matrix T. More particularly, the transition between state 1 710 and state 1 710 corresponds to element $a_{1,1}$ of the matrix T, the transition between state 1 710 and state 2 720 corresponds to element $a_{1,2}$ of the matrix T, the transition between state 2 720 and state 3 730 corresponds to element $a_{2,3}$ of the matrix T, etc.

Though embodiments of the present invention have been described in conjunction with the design and implementation of third order statistical filters among others, it will be apparent to those of skill in the art that embodiments of the present invention may be utilized to design and implement higher order statistical filters as well, such as by, for example, cascading third order filter structures.

In the foregoing specification, the invention has been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention. For example, it will be apparent to those of skill in the art that although the present invention has been described with respect to a protocol controller in a routing device the inventions and methodologies described herein may be applied in any context which requires the determination of the protocol of a bit stream.

Benefits, other advantages, and solutions to problems have been described above with regard to specific embodiments. However, the benefits, advantages, solutions to problems, and any component(s) that may cause any benefit, advantage, or solution to occur or become more pronounced are not to be construed as a critical, required, or essential feature or component of any or all the claims.

What is claimed is:

1. A method for implementing a statistical filter, comprising:

mapping a power spectrum to find pole locations that approximate the power spectrum; determining a set of eigenvalues, wherein determining the set of eigenvalues comprises mapping the pole locations to the edges of, or inside of, a polygon laying inside a unit circle, the polygon having the same number of sides as an order of the statistical filter and a vertex mapped to unity;

obtaining a stochastic matrix from the set of eigenvalues, wherein the stochastic matrix comprises a set of values;

storing the set of values of the stochastic matrix; and utilizing the set of values of the stochastic matrix as transition probabilities for the statistical filter.

2. The method of claim 1, wherein the statistical filter is operable to implement a band pass, band stop, low pass or high pass filter.

3. The method of claim 1, wherein the stochastic matrix is a first circulant matrix.

4. The method of claim 3, wherein obtaining the first circulant matrix comprises looking up one of the set of eigenvalues in a table.

5. The method of claim 4, wherein each entry in the table comprises a second circulant matrix and an associated eigenvalue.

6. The method of claim 5, wherein one or more of the second circulant matrices is determined by using a summed structure.

7. The method of claim 5, wherein one or more of the second circulant matrices is determined by using a ring structure.

8. The method of claim 1, wherein the statistical filter is operable for use with an utlrawideband (UWB) signal.

9. The method of claim 8, wherein the statistical filter is operable to substantially reduce the power of the UWB signal between around 3.5 GHz and around 4.2 GHz.

10. A statistical filter, comprising:

a set of transition probabilities, the set of transition probabilities determined by:

mapping a power spectrum to find pole locations that approximate the power spectrum;

determining a set of eigenvalues, wherein determining the set of eigenvalues comprises mapping the pole locations to the edges of, or inside of, a polygon laying inside a unit circle, the polygon having the same number of sides as an order of the statistical filter and a vertex mapped to unity;

obtaining a stochastic matrix from the set of eigenvalues, wherein the stochastic matrix comprises the set of transition probabilities; and storing the set of transition probabilities.

11. The statistical filter of claim 10, wherein the statistical filter is operable to implement a band pass, band stop, low pass or high pass filter.

12. The statistical filter of claim 10, wherein the stochastic matrix is a first circulant matrix.

13. The statistical filter of claim 12, wherein obtaining the first circulant matrix comprises looking up one of the set of eigenvalues in a table.

14. The statistical filter of claim 13, wherein each entry in the table comprises a second circulant matrix and an associated eigenvalue.

15. The statistical filter of claim 14, wherein one or more of the second circulant matrices is determined by using a summed structure.

16. The statistical filter of claim 14, wherein one or more of the second circulant matrices is determined by using a ring structure.

17. The statistical filter of claim 10, wherein the statistical filter is operable for use with an utlrawideband (UWB) signal.

18. The statistical filter of claim 17, wherein the statistical filter is operable to substantially reduce the power of the UWB signal between around 3.5 GHz and around 4.2 GHz.

19. A statistical filter for implementing a band stop filter for use with a UWB signal, comprising:
  a set of transition probabilities, the set of transition probabilities determined by:
  mapping a power spectrum to find pole locations that approximate the power spectrum, wherein the power spectrum has substantially reduced power between around 3.5 GHz and around 4.2 GHz.;
  determining a set of eigenvalues, wherein determining the set of eigenvalues comprises mapping the pole locations to the edges of, or inside of, a polygon laying inside a unit circle, the polygon having the same number of sides as an order of the statistical filter and a vertex mapped to unity;
  obtaining a circulant matrix from the set of eigenvalues, wherein the circulant matrix comprises the set of transition probabilities; and
  storing the set of transition probabilities.

20. A method for implementing a statistical filter, comprising:
  mapping a power spectrum to find pole locations that approximate the power spectrum;
  determining a set of eigenvalues, wherein determining the set of eigenvalues comprises mapping the pole locations to the edges of, or inside of, a polygon laying inside a unit circle, the polygon having the same number of sides as an order of the statistical filter and a vertex mapped to unity;
  obtaining a stochastic matrix from the set of eigenvalues, wherein the stochastic matrix comprises a set of values;
  utilizing the set of values of the stochastic matrix as transition probabilities for the statistical filter; and
  filtering a signal using the statistical filter.

* * * * *